(12) United States Patent
Yu et al.

(10) Patent No.: US 8,709,267 B2
(45) Date of Patent: Apr. 29, 2014

(54) DOUBLE PATTERNING METHOD USING TILT-ANGLE DEPOSITION

(75) Inventors: Chwen Yu, Taipei (TW); Fei-Gwo Tsai, Tainan (TW); Kai-Wen Cheng, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 192 days.

(21) Appl. No.: 13/188,248

(22) Filed: Jul. 21, 2011

(65) Prior Publication Data

US 2013/0023121 A1 Jan. 24, 2013

(51) Int. Cl.
*H01L 21/302* (2006.01)

(52) U.S. Cl.
USPC ............ 216/39; 216/41; 216/46; 216/47; 216/49; 216/51; 438/694; 438/696; 438/735; 438/942; 204/192.11

(58) Field of Classification Search
None
See application file for complete search history.

(56) References Cited

U.S. PATENT DOCUMENTS

| | | | | |
|---|---|---|---|---|
| 4,256,816 A | * | 3/1981 | Dunkleberger | 430/11 |
| 4,525,919 A | * | 7/1985 | Fabian | 438/577 |
| 4,687,730 A | * | 8/1987 | Eron | 430/324 |
| 5,366,849 A | * | 11/1994 | Nakagawa et al. | 430/314 |
| 5,610,090 A | * | 3/1997 | Jo | 438/577 |
| 7,459,266 B2 | * | 12/2008 | Sun et al. | 430/319 |
| 2004/0029050 A1 | * | 2/2004 | Brenner et al. | 430/312 |

OTHER PUBLICATIONS

Dawei Yang et al., "Spin Dependent Transport in Ferromagnet/Superconductor/Ferromagnet Single Electron Transistor", Journal of Applied Physics 97, 10A708 (2005), 3 pages.
Stefan Egger et al., Dynamic Shadow Mask Technique: A Universal Tool for Nanoscience, 2005 American Chemical Society, Nano Letters, 2005, vol. 5, No. 1, pp. 15-20.
Chao-Peng Chen et al., "Process Control of Photoresist Undercut for Lift-Off Patterns Below 100 nm", Emerging Lithographic Technologies IX, Proceedings of SPIE vol. 5751, 2005, pp. 601-608.
Center of Excellence in Nanoelectronics, Indian Institute of Science, Bangalore, "Surface Modification Lift-Off Process Using Direct Write Laser Lithography" 1 page.
Mark D. Feuer et al., "Projection Photolithography-Liftoff Technique for Production of 0.2-μm Metal Patterns". IEEE Transactions on Electron Devices, vol. ED-28, No. 11, Nov. 1981, pp. 1375-1378.

* cited by examiner

*Primary Examiner* — Anita Alanko
(74) *Attorney, Agent, or Firm* — Haynes and Boone, LLP

(57) ABSTRACT

Methods for patterning material layers, which may be implemented in forming integrated circuit device features, are disclosed. In an example, a method includes forming a first resist layer over a material layer; forming a second resist layer over the first resist layer; forming an opening that extends through the second resist layer and the first resist layer to expose the material layer, wherein the opening has a substantially constant width in the second resist layer and a tapered width in the first resist layer; and performing a tilt-angle deposition process to form a feature over the exposed material layer.

20 Claims, 10 Drawing Sheets

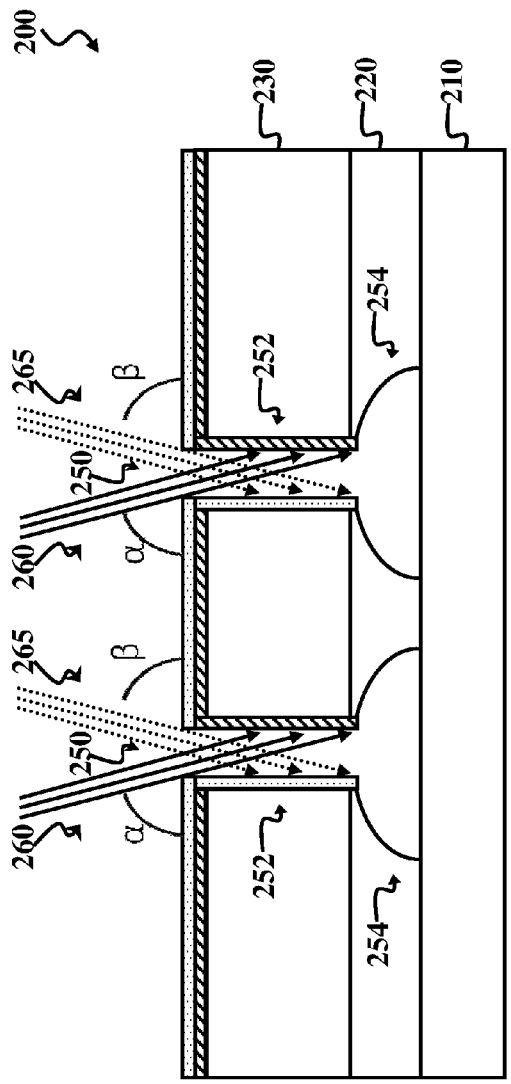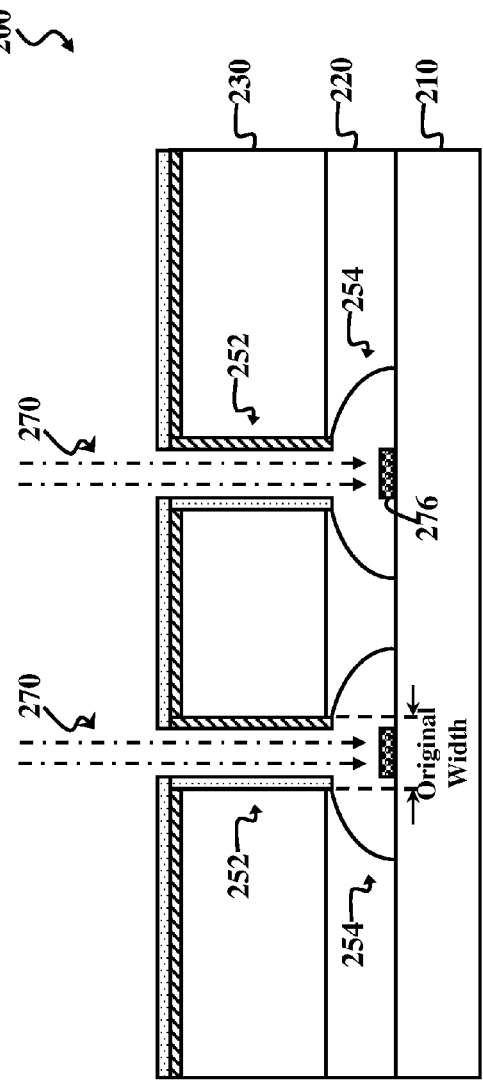

DOUBLE PATTERNING METHOD USING TILT-ANGLE DEPOSITION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as geometry sizes shrink, conventional patterning processes (such as conventional photolithography processes) have difficulty forming IC features having small geometry sizes, particularly as technology nodes continue evolving to 20 nm and below. As a result, double patterning, extreme ultraviolet (EUV), and electron beam writing methods have been implemented to achieve these smaller geometry sizes. However, such methods introduce significant increase in manufacturing costs, and in some cases, significant increase in manufacturing processes (and thus manufacturing time). Accordingly, although existing IC patterning methods approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-9 and FIGS. 10A-10B are various diagrammatic cross-sectional views of various embodiments of an integrated circuit device during various fabrication stages according to the method of FIG. 1.

DETAILED DESCRIPTION

Figure 1:
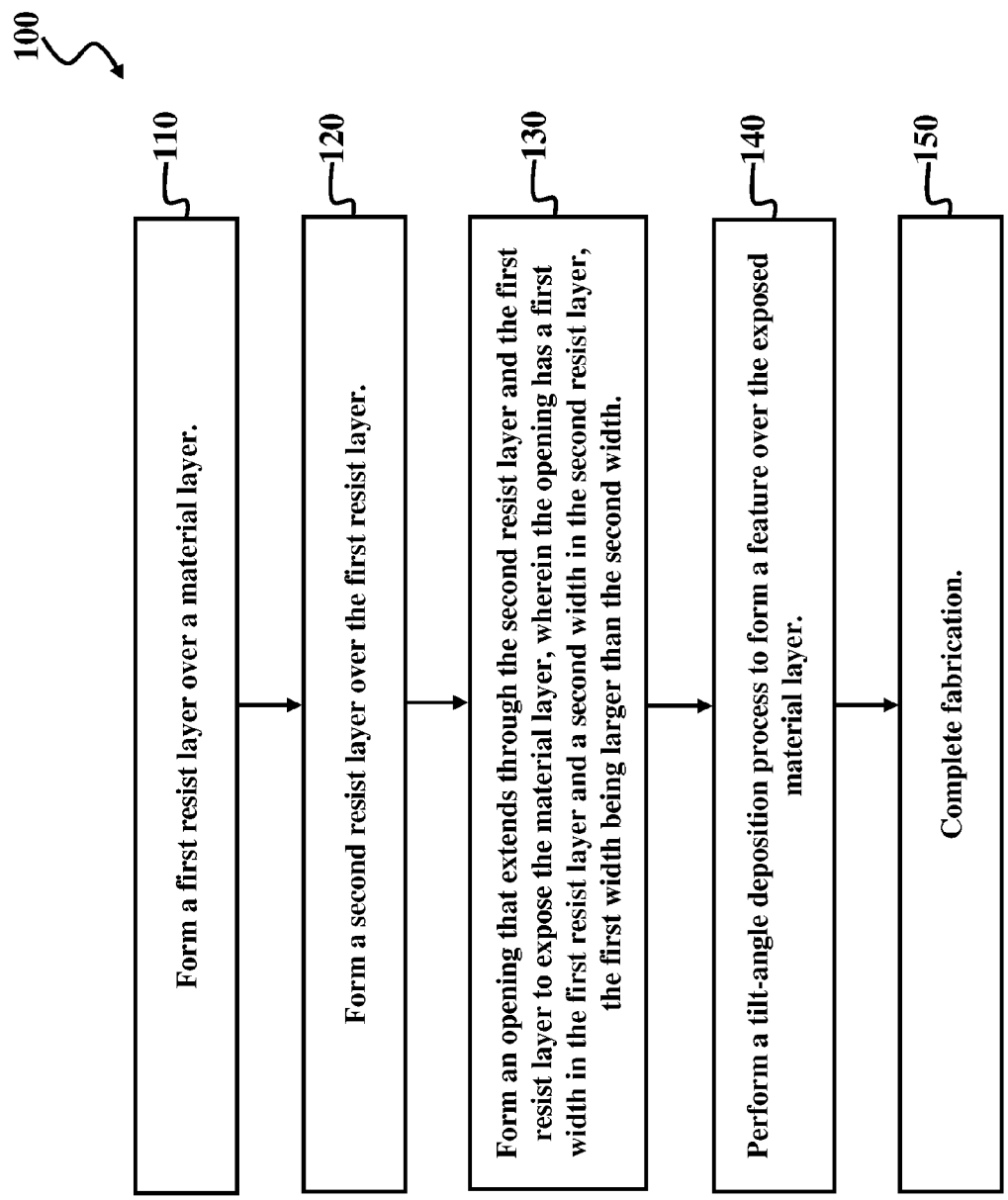
FIG. 1 is a flow chart of a method for fabricating a patterned material layer according to an embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of an embodiment of a method 100 for fabricating an integrated circuit device feature according to various aspects of the present disclosure. The method 100 begins at block 110 where a first resist layer is formed over a material layer. At block 120, a second resist layer is formed over the first resist layer. At block 130, an opening is formed that extends through the second resist layer and the first resist layer to expose the material layer. The opening has a substantially constant width in the second resist layer and a tapered width in the second resist layer. In an example, the first resist layer and the second resist layer form a resist layer having an undercut profile. At block 140, a feature is formed over the exposed material layer using a tilt-angle deposition process. In an example, at least two tilt-angle deposition processes form a patterned layer over the material layer. In another example, the feature is a patterned hard mask layer that is used to etch the material layer to form the integrated circuit device feature. In another example, the feature may be the integrated circuit device feature, such as a layer of a gate stack formed over a substrate (the material layer) or a contact formed over the material layer. The method 100 may continue at block 150 to complete fabrication of the integrated circuit device. For example, the first resist layer and the second resist layer may be subsequently removed by a suitable process, such as a lift-off process. Thereafter, where the feature is a patterned hard mask layer, the patterned hard mask layer is used to etch the material layer to form the integrated circuit device feature, such as a gate stack or a contact. Additional steps can be provided before, during, and after the method 100, and some of the steps described can be replaced, eliminated, or moved around for additional embodiments of the method. The discussion that follows illustrates various embodiments of an integrated circuit device that can be fabricated according to the method 100 of FIG. 1.

FIGS. 2-10 are various diagrammatic cross-sectional views of various embodiments of an integrated circuit device 200 during various fabrication stages according to the method 100 of FIG. 1. FIGS. 2-10 have been simplified for the sake of clarity to better understand the inventive concepts of the present disclosure. Additional features can be added in the integrated circuit device 200, and some of the features described below can be replaced or eliminated for additional embodiments of the integrated circuit device 200.

Figure 2:
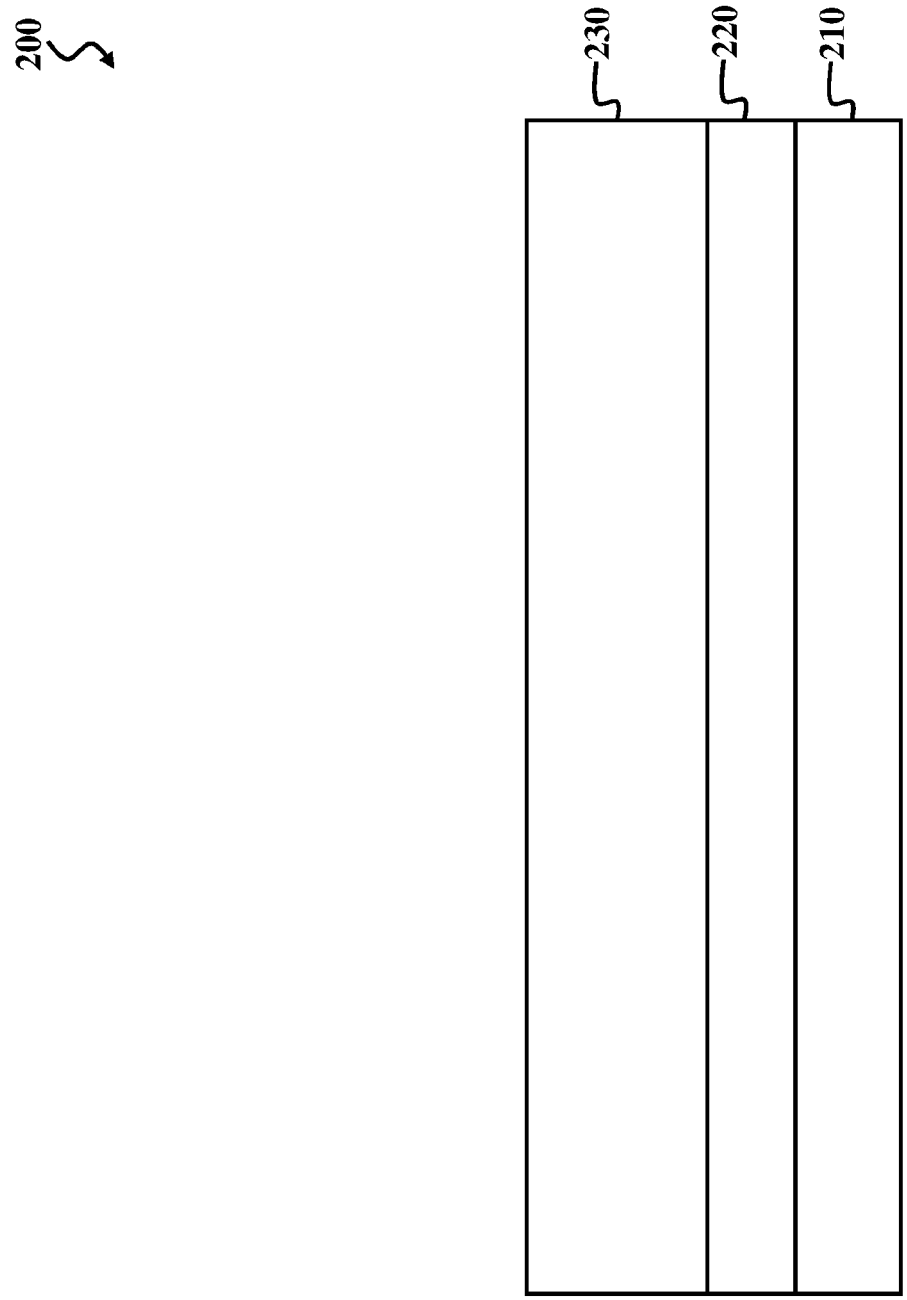

In FIG. 2, a substrate 210 is provided. In the depicted embodiment, the substrate 210 is a semiconductor substrate including silicon. Alternatively or additionally, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer. Alternatively, the substrate 210 may include a non-semiconductor material, such as a glass substrate for thin-film-transistor liquid crystal display (TFT-LCD) devices, or fused quartz or calcium fluoride for a photomask (mask). The substrate 210 may alternatively be referred to as a material layer, or the substrate 210 may include a material layer upon which features will be formed or in which a pattern will be transferred (for example, by etching) to form features of the integrated circuit device 200. In an example, the material layer is a metal layer, a semiconductor layer, or a dielectric layer. In another example, the material layer is a hard mask layer, such as a silicon oxide layer or a silicon nitride layer.

A resist layer 220 is disposed over the substrate 210, and a resist layer 230 is disposed over the resist layer 220. The resist layers 220 and 230 may also be referred to as photoresist layers, photosensitive layers, imaging layers, patterning layers, or radiation sensitive layers. The resist layers 220 and 230 are formed over the substrate 210 by a suitable process, for example, by a spin-coating technique, which may include baking each resist layer 220 and 230 after coating. The resist layers 220 and 230 may include positive-type or negative-type resist materials. The resist layer 220 and the resist layer 230 include materials that are configured to achieve an undercut profile after patterning the resist layers 220 and 230, as discussed further below. In the depicted embodiment, the resist layer 220 is configured as an undercut resist layer, and the resist layer 230 is configured as a window-open resist layer. For example, the resist layer 220 and the resist layer 230 include poly(methylmethacrylate) (PMMA) in varying concentration levels, such as the resist layer 220 having a PMMA concentration of less than or equal to about 2% and the resist layer 230 having a PMMA concentration of about 4% to about 6%. In an example, the resist layer 220 and/or the resist layer 230 may have a multi-layer structure. The resist layers 220 and 230 have any suitable thickness. For example, the resist layer 220 has a thickness of about 100 nanometers (nm) to about 3,000 nm, and the resist layer 230 has a thickness of about 100 nm to about 5,000 nm. One or more antireflective layers, such as top antireflective coating (TARC) layers or bottom antireflective (BARC) layers, may be disposed between the substrate 210 and the resist layer 220, between the resist layer 220 and the resist layer 230, over the resist layer 230, or a combination thereof.

Figure 3:
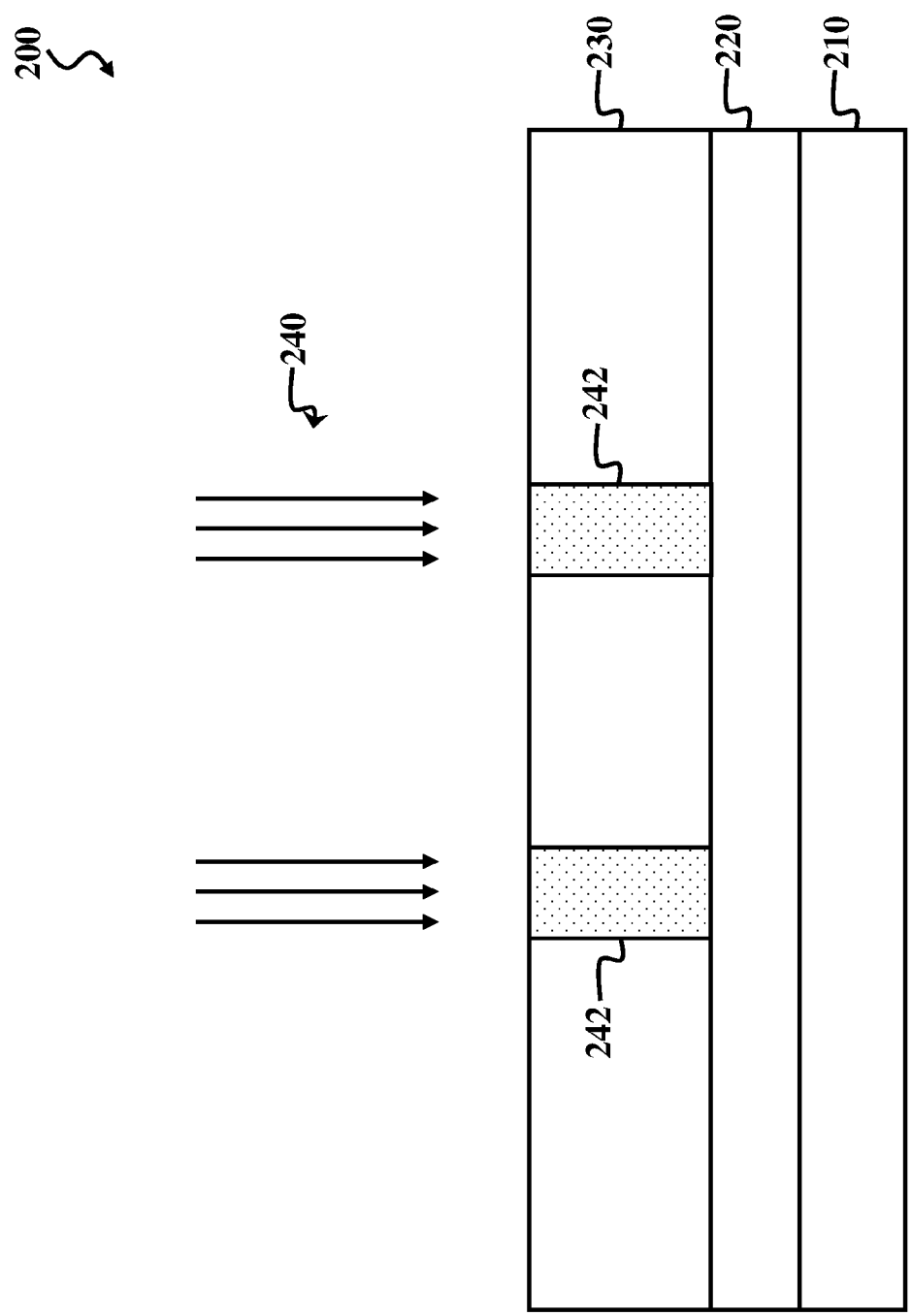
Figure 4:
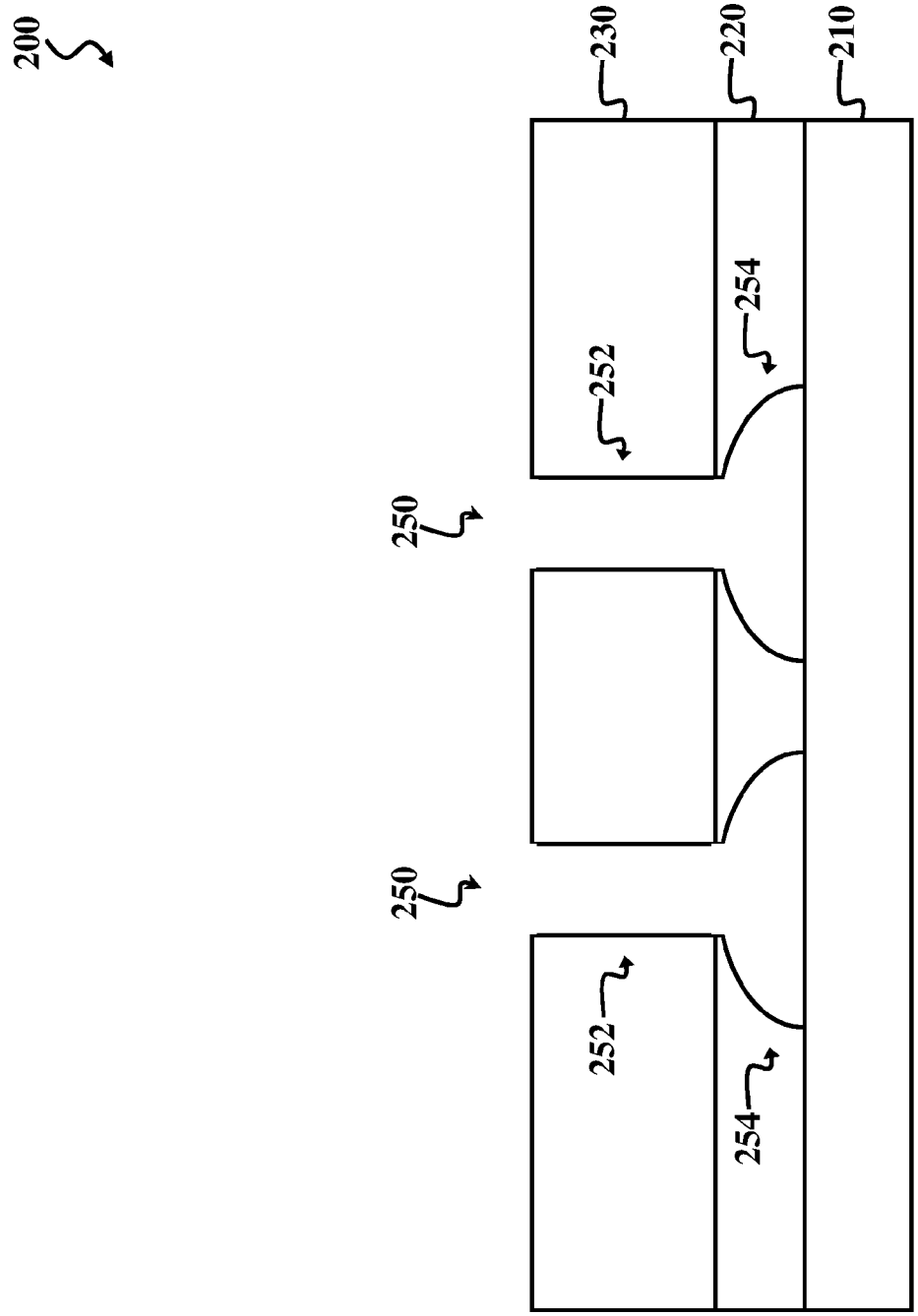

In FIGS. 3 and 4, the resist layers 220 and 230 are patterned to form a patterned resist layer having at least one opening therein. In FIG. 3, the resist layer 230 is subjected to an exposure process 240. For example, the resist layer 230 is exposed to a radiation energy, such as ultraviolet (UV) radiation, through a mask (photomask or reticle) having a pre-defined pattern, resulting in a resist pattern that includes exposed regions of the resist layer 230, such as exposed portions 242. The radiation energy may use a 248 nm beam by krypton fluoride (KrF) excimer laser or a 193 nm beam by argon fluoride (ArF) excimer laser. Thereafter, the resist layer 230 may be subjected to a post-exposure bake (PEB) process.

In FIG. 4, the resist layer 230 is developed by a suitable process. For example, the resist layer 230 is exposed to a developing solution, such as tetramethylammonium hydroxide (TMAH), to remove portions of the resist layer 230. Any concentration level of TMAH developer solution is utilized depending on characteristics of the resist layer 230, such as approximately 2.38% TMAH developer solution. In the depicted embodiment, the developing solution removes the exposed portions 242 of the resist layer 230 and etches the underlying resist layer 220 to form openings 250 that extend through the resist layers 220 and 230. Alternatively, the developing solution may remove the unexposed portions of the resist layer 230. The openings 250 extend through the resist layer 230 and the resist layer 220 to expose the substrate 210. In the depicted embodiment, as noted above, the materials of the resist layers 220 and 230 are configured to achieve an undercut profile in the patterned resist layers 220 and 230, and thus, the openings 250 have portions 252 and 254. The portions 252 have a substantially constant or uniform width, and the portions 254 have a tapered width. Thereafter, a rinsing process, such as a de-ionized (DI) water rinse, may be performed.

In the depicted embodiment, as described above, two resist layers (resist layer 220 and resist layer 230) are exposed and developed to achieve openings 250 that expose the substrate 210, where the openings 250 include portion 252 (a top vertical portion or "window open" portion) and portion 254 (a bottom undercut portion or "undercut" portion). Alternatively, the resist layers 220 and 230, which have varying PMMA concentrations in the present example, are subjected to electron-beam (e-beam) lithography to form the openings 250. In yet another alternative, a single resist layer (not separate resist layers) is exposed and developed, similar to that described above, to achieve openings having a window open portion and an undercut portion. For example, the single resist layer includes photoacid generator, and by controlling (or tuning) the lithography processes, photoacid generation is controlled (tuned) to obtain exposure areas in the resist layer that have profiles with a window open portion and an undercut portion, such that when the single resist layer is developed, openings in the single resist layer are similar to openings 250. In an example, changing a depth of focus and/or baking recipe (such as a soft baking recipe) controls photoacid generation to achieve openings substantially similar to openings 250. In yet another alternative, more than two resist layers may be used to achieve the profile of the openings 250. Thus, any lithography process that achieves openings having a window open portion and an undercut portion may be used to achieve the openings 250.

Figure 5:
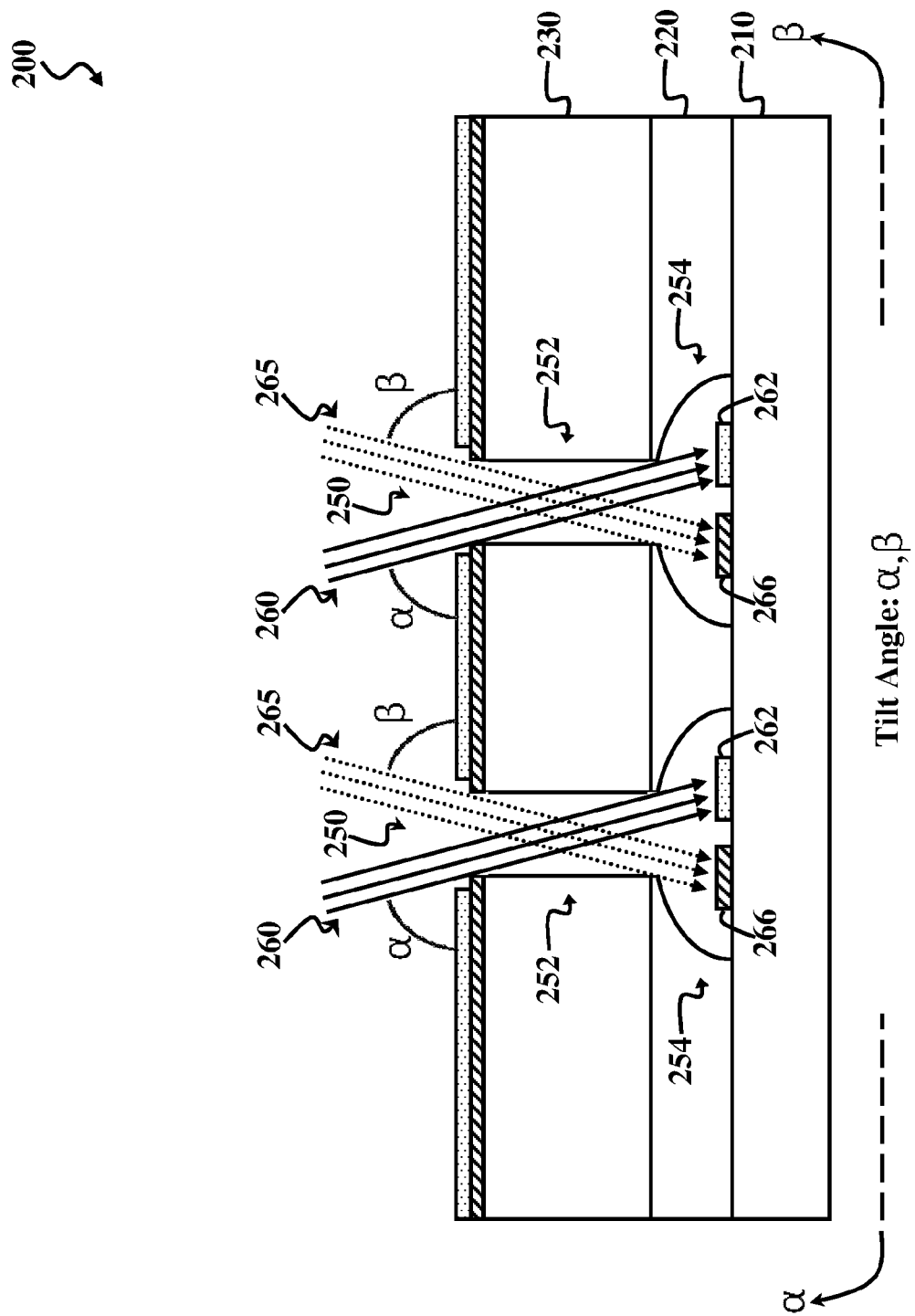

In FIG. 5, a tilt-angle deposition process forms features over the exposed substrate 210. For example, a first tilt-angle deposition process 260 forms features 262 over the exposed portions of the substrate 210, and a second tilt-angle deposition process 265 forms features 266 over the exposed portions of the substrate 210. In the depicted embodiment, the first and second tilt-angle deposition processes 260 and 265 are physical vapor deposition (PVD) processes. In an example, the PVD process is a sputtering process that implements a collimator. The collimator is positioned between a sputter target and the substrate 210 (having the resist layers 220 and 230 disposed thereover), such that the collimator is a distance from the substrate 210. For example, the distance from the collimator to the substrate 210 is less than an atomic (or molecular) mean free path of material deposited during the sputtering process. In another example, the PVD process is a thermal evaporation process.

The first tilt-angle deposition process 260 is performed at a tilt angle $\alpha$, and the second tilt-angle deposition process 265 is performed at a tilt angle $\beta$. The tilt angles $\alpha$ and $\beta$ are achieved by rotating a substrate holder that the substrate 210 is disposed over. In the depicted embodiment, the tilt-angle deposition processes 260 and 265 deposit a same material, and thus, the features 262 and 266 include a same material. For example, the tilt-angle deposition processes 260 and 265 deposit a hard mask material (such as silicon nitride, silicon oxynitride, silicon carbide, other suitable hard mask material, or combination thereof), and thus, the features 262 and 266 form a patterned hard mask layer over the substrate 210. The tilt-angle deposition processes 260 and 265 may deposit other materials, such that the features 262 and 266 form a pattern of integrated circuit device features over the substrate 210. Alternatively, the tilt-angle deposition processes 260 and 265 deposit different materials, such that a material of features 262 is different than a material of features 266.

Figure 6A:
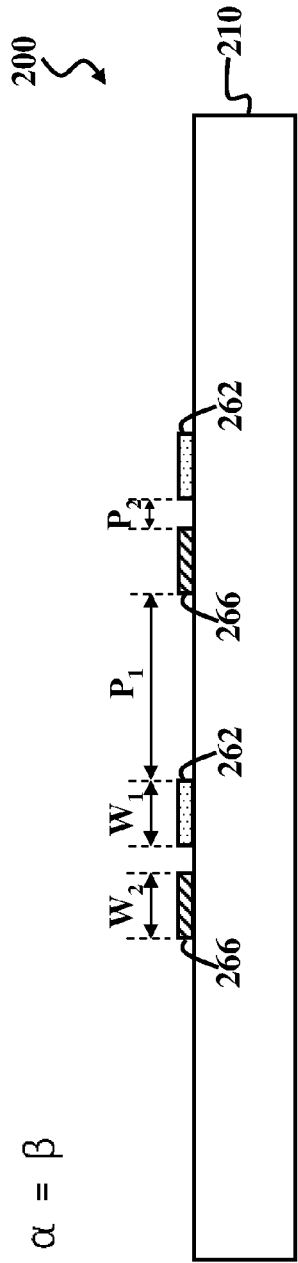
Figure 6B:
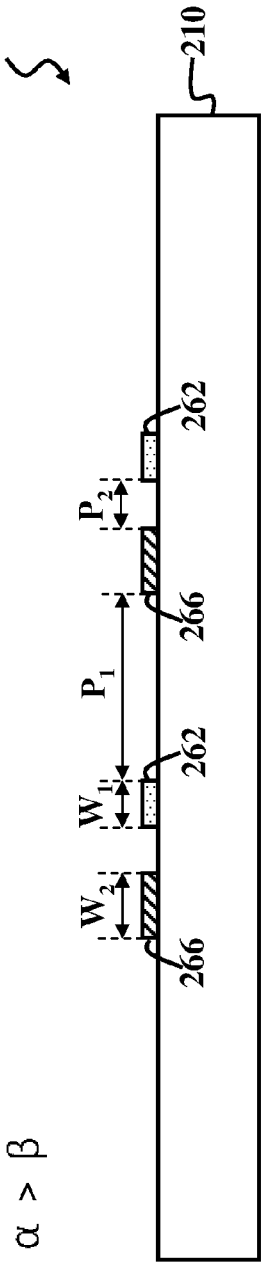
Figure 6C:
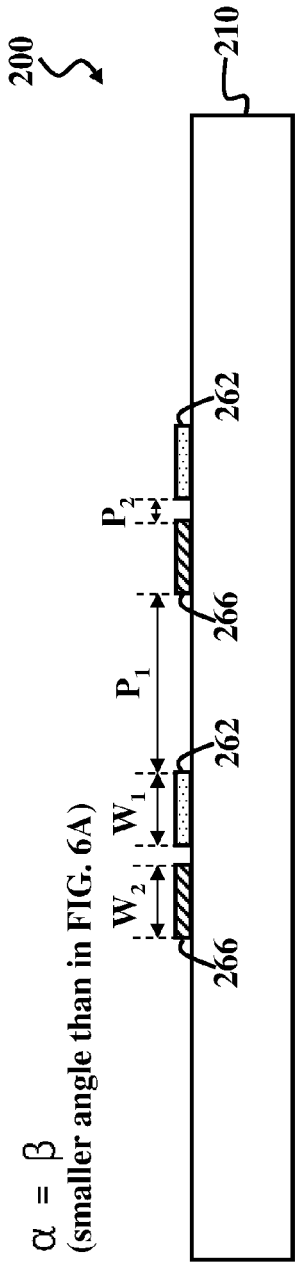

In FIGS. 6A-6C, the resist layers 220 and 230 are removed by a suitable process, such as a lift-off process, leaving a patterned material layer (features 262 and features 266) over the substrate 210. In an example, the various patterned material layers (including features 262 and features 266) form patterned hard mask layers that are used as masks to etch the substrate 210 that is not covered by the patterned hard mask layers. The substrate 210 may be etched using the patterned hard mask layers to form integrated circuit device features, such as gates, contacts, or other suitable integrated device features. In another example, the various patterned material layers (including features 262 and features 266) form integrated circuit features, such as dielectric or metal features, of the integrated circuit device 200.

Each of FIGS. 6A-6C illustrate how the tilt angles α and β of the tilt-angle deposition processes 260 and 265, respectively, can be varied to adjust a pitch between the features 262 and features 266 within each opening 250, and a width of the features 262 and 266. After the tilt-angle deposition processes 260 and 265, the features 262 have a width, $W_1$, and the features 266 have a width, $W_2$. In FIG. 6A, using a same tilt angle for the tilt-angle deposition processes 260 and 265 (α=β), the features 262 and the features 266 have equal widths ($W_1=W_2$); a pitch, $P_1$, is between a first set of features 262 and 266 and a second set of features 262 and 266; and a pitch, $P_2$, is between a feature 262 and a feature 266 within each opening 250. In FIG. 6B, when tilt-angle deposition process 265 uses a smaller tilt angle than tilt-angle deposition process 265 (α>β), the width of features 262 is smaller than the width of features 266 ($W_1<W_2$); a pitch, $P_1$, is smaller than the pitch, $P_1$, achieved when using the same tilt angle for both tilt-angle deposition processes 260 and 265; and a pitch, $P_2$, is larger than the pitch $P_2$, achieved when using the same tilt angle for both tilt-angle deposition processes 260 and 265. In FIG. 6C, using a same tilt angle for the deposition processes (α=β), but the tilt angle being smaller than that used in FIG. 6A, the features 262 and the features 266 have equal widths ($W_1=W_2$) that are greater than the widths of the features 262 and 266 in FIG. 6A; a pitch, $P_1$, is greater than the pitch, $P_1$, in FIG. 6A; and a pitch, $P_2$, is less than the pitch $P_2$, in FIG. 6A. The thicknesses of the resist layers 220 and 230 and widths of the openings 250 may also be varied to adjust the width and pitch of the features 262 and the features. Accordingly, tilt angle, thickness of resist layers, and widths of the openings within the patterned resist layers may be varied to achieve various sizes and pitches of patterned material layers.

Figure 7:
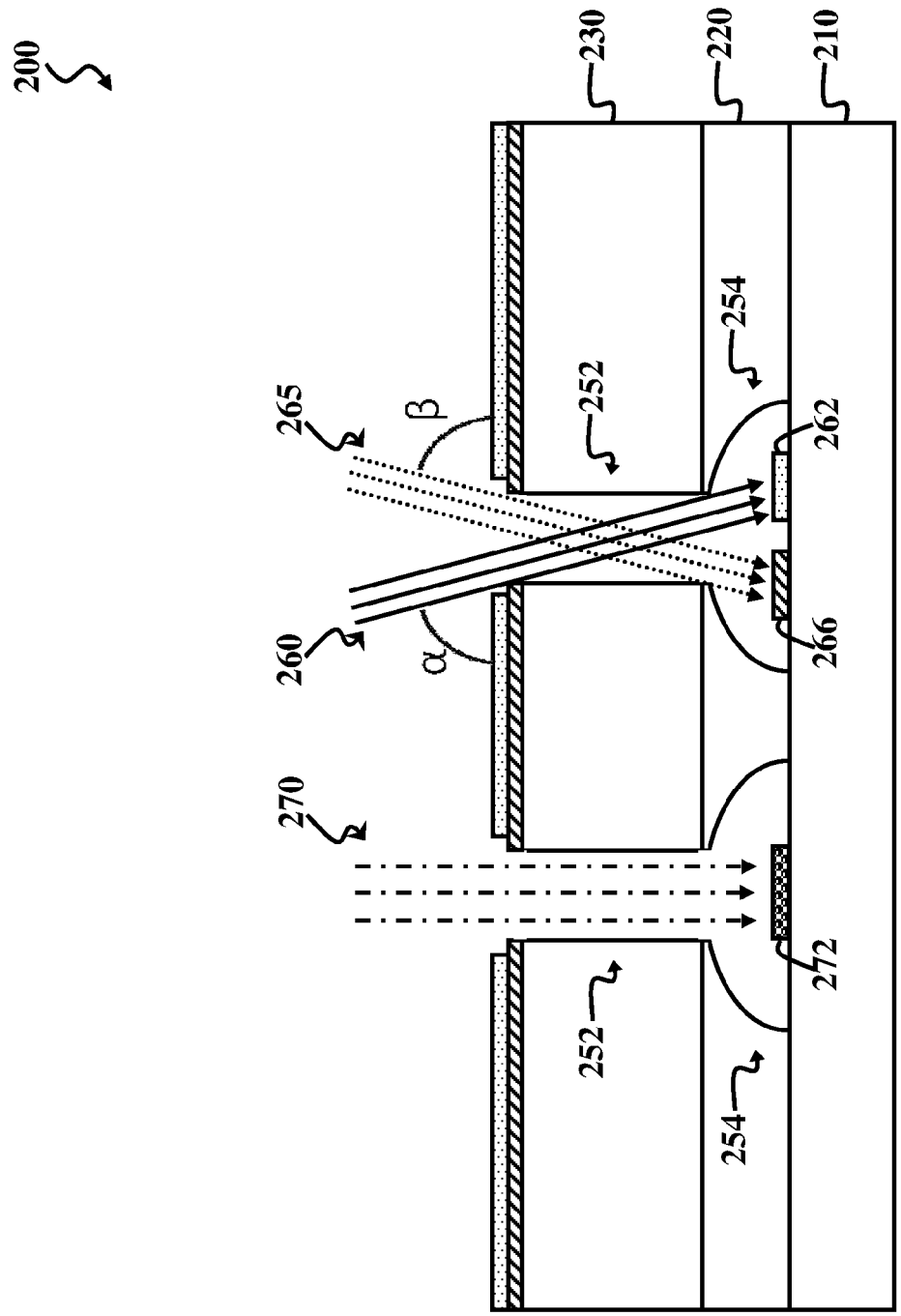
Figure 8:
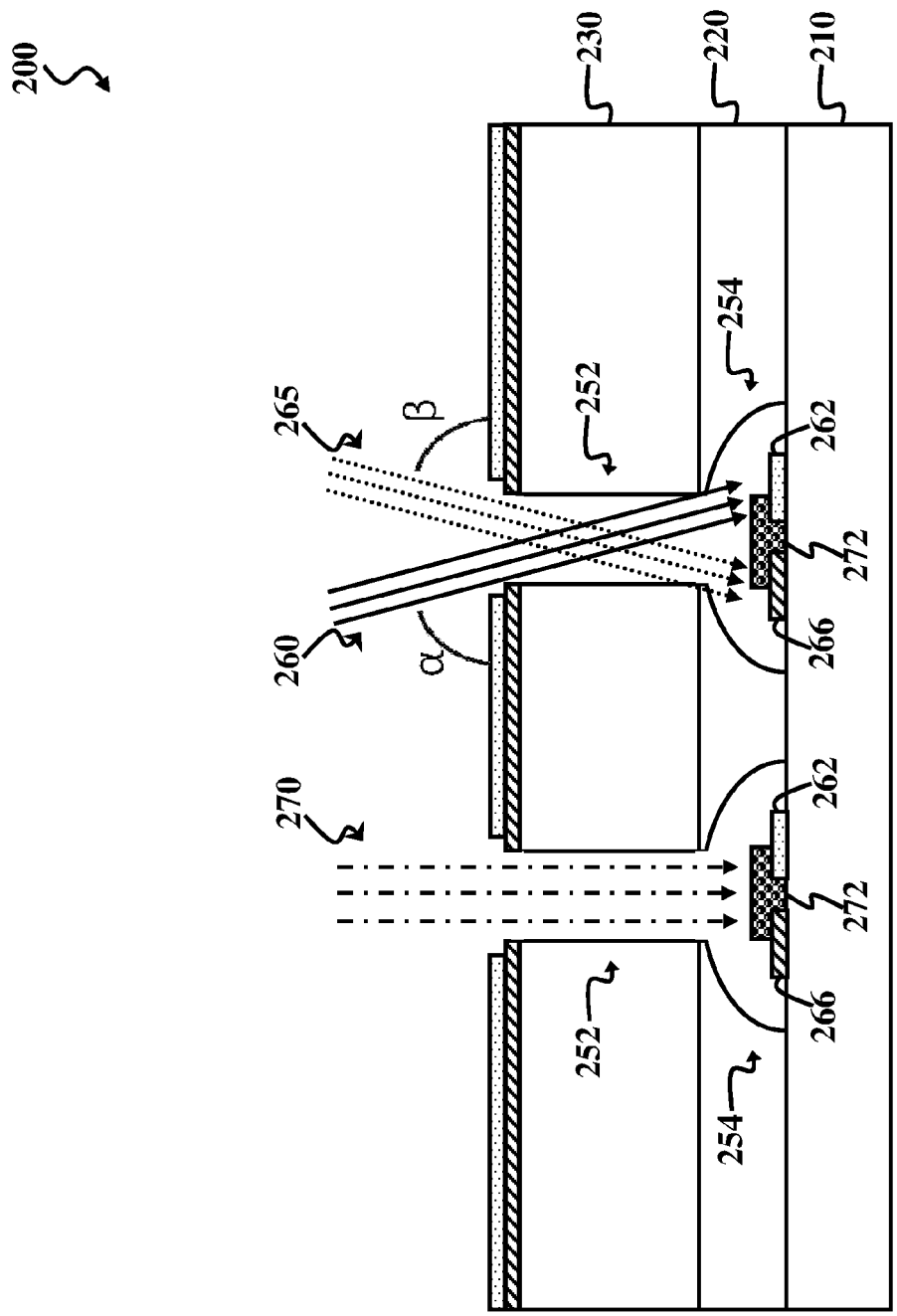
Figure 9:
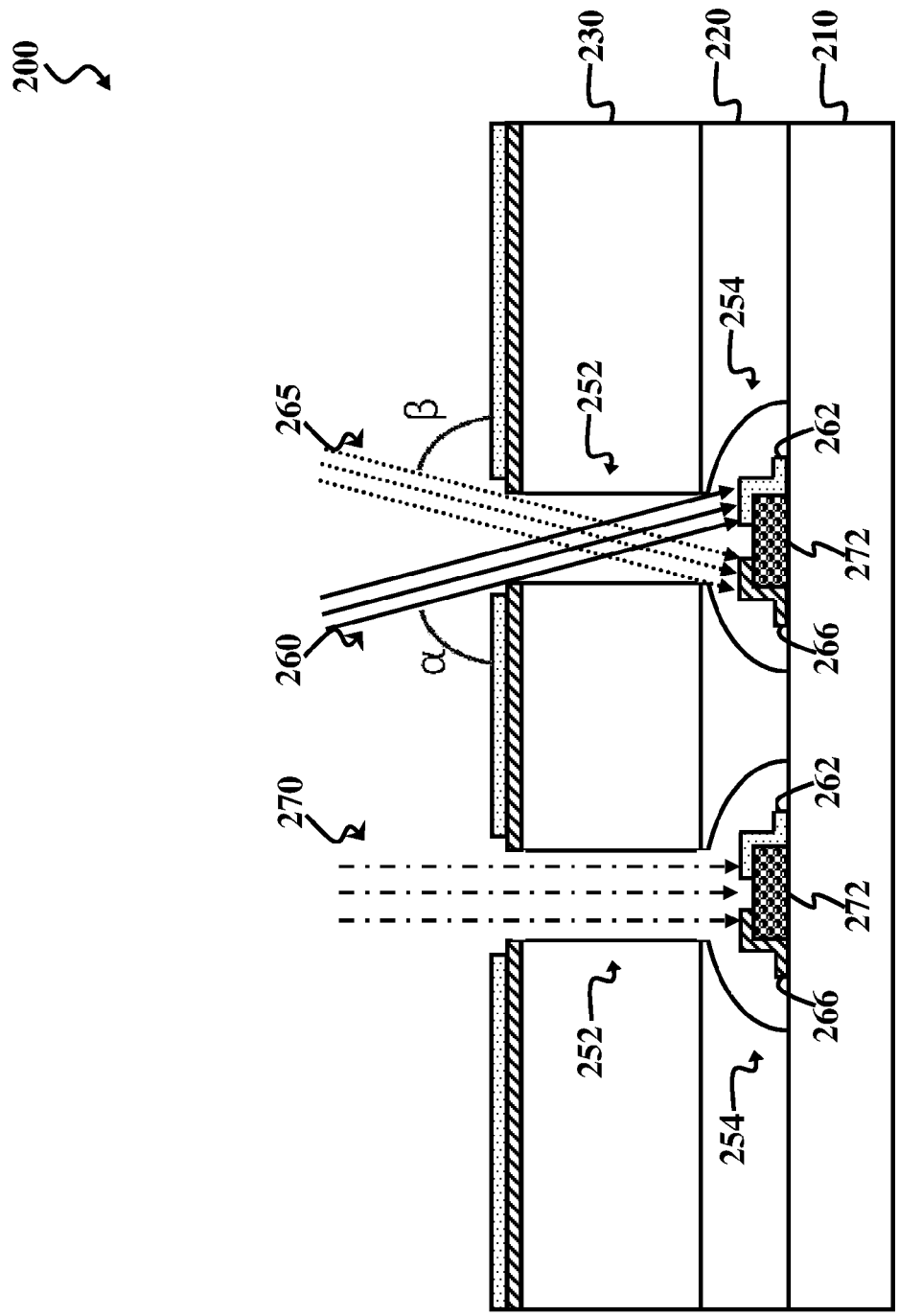

FIGS. 7-9 illustrate various deposition processes that can be performed to form various patterned material layers over the substrate 210. For example, in FIG. 7, tilt-angle deposition processes 260 and 265 are performed to form features 262 and 266 over the exposed substrate 210 in one of the openings 250; and a deposition process 270 (where a tilt angle is 0°) is performed to form feature 272. The tilt-angle deposition processes 260, 265, and 270 may deposit same or different materials depending on the desired features or patterned material layer. In an example, the features 262, 266, and 272 include the same material. In another example, the features 262 and 266 include a same material, and the feature 272 includes a material different than the features 262 and 266. In yet another example, each of the features 262, 266, and 272 include a different material. In FIGS. 8 and 9, the deposition processes 260, 265, and 270 are used to achieve varying configurations of features 262, 266, and 272. For example, in FIG. 8, the tilt-angle deposition processes 260 and 265 form features 262 and features 266 over the exposed portions of the substrate 210, respectively; and then, the deposition process 270 forms the features 272 over the features 262 and features 266. In another example, in FIG. 9, first, the deposition process 270 forms the features 272 over the exposed portions of the substrate 210; and then, the tilt-angle deposition processes 260 and 265 form the features 262 and the features 266, respectively, over the features 272. In FIGS. 8 and 9, the deposition processes 260, 265, and 270 may deposit same or different materials to achieve various configurations of the materials of the features 262, 266, and 272.

FIGS. 10A-10B illustrate how the tilt-angle deposition processes 260 and 265 can be used to narrow a width of a window for depositing a patterned material layer. In FIG. 10A, a tilt angle of the tilt-angle deposition processes 260 and 265 is enlarged to ensure that material is deposited on sidewalls of the openings 250, and not over the exposed portions of the substrate 210. The material deposited by the tilt-angle deposition processes 260 and 265 narrows a window of the openings 250. Thereafter, in FIG. 10B, the deposition process 270 forms features 276 over the exposed portions of the substrate 210. Because the tilt-angle deposition processes 260 and 265 narrow the window of the openings 250, the features 276 have a narrower width than an original width (consistent with a width of the window of the openings 250) that would have been achieved without first narrowing the window of the openings.

Using the tilt-angle deposition processes, such as tilt-angle deposition processes 260, 265, and 270, in the foregoing patterning of various features extends use of conventional lithography processes (such as those used in 40 nm technology nodes and above) to next generation technology nodes, particularly to 20 nm technology nodes and below. For example, patterning using the tilt-angle deposition processes can achieve feature sizes desired for 20 nm technology nodes and below (such as 20 nm line widths) while using processing typically associated with greater than 20 nm technology nodes. Accordingly, desired feature sizes can be achieved without using costly approaches, such as extreme ultraviolet (EUV) patterning methods and/or electron-beam (e-beam) patterning methods. Further, using tilt-angle deposition processes can provide patterning free of diffraction effects, which arise when conventional lithography processes are used to form the smaller device features necessary in 20 nm technology nodes and below.

The present disclosure provides for many different embodiments. In an example, a method includes forming a first resist layer over a material layer; forming a second resist layer over the first resist layer; forming an opening that extends through the second resist layer and the first resist layer to expose the material layer, wherein the opening has a substantially constant width in the second resist layer and a tapered width in the first resist layer; and performing a tilt-angle deposition process to form a feature over the exposed material layer. Performing the tilt angle deposition process includes performing a first tilt-angle deposition process at a first angle to form a first feature over the exposed material layer, and performing a second tilt-angle deposition process at a second angle to form a second feature over the exposed material layer. The first angle and the second angle may be adjusted to achieve a desired width for the first feature and a desired width for the second feature, and/or a desired pitch between the first feature and the second feature.

In an example, the first tilt-angle deposition process deposits a first material, and the second tilt-angle deposition process at the second angle to form the second feature includes depositing a second material. The deposited first and second materials may form a patterned hard mask layer over the exposed material layer. The method may further include using a lift-off process to remove the first resist layer and the second resist layer. The method may further include using the feature as a mask to etch the material layer. The method may further including performing a deposition process to form another feature over the exposed material layer. The material layer may be positioned on a substrate holder, and performing the tilt-angle deposition process may includes rotating the substrate holder to achieve a tilt angle for the tilt-angle deposition process.

In another example, a method includes forming a photoresist layer over a material layer; performing a lithography process on the photoresist layer to form an opening in the photoresist layer that exposes the material layer, the opening having an undercut profile; and forming a feature over the exposed material layer, wherein the forming the feature includes performing at least two tilt-angle deposition processes. The feature may be a patterned hard mask layer. To achieve a desired size and pitch of the patterned hard mask layer, the method may include varying one of a thickness of the photoresist layer, a width of the opening in the photoresist layer, and a tilt angle of each of the at least two tilt-angle deposition processes. The method further includes removing the photoresist layer; and using the patterned hard mask layer to etch the material layer.

In one example, forming the feature over the exposed material layer includes performing a first tilt-angle deposition process and a second tilt-angle deposition process, wherein the first tilt-angle deposition process and the second tilt-angle deposition process narrow the opening in the photoresist layer; and after performing the first tilt-angle deposition process and the second tilt-angle deposition process, performing a deposition process to form the feature over the exposed material layer. In another example, forming the feature over the exposed material layer includes performing a first tilt-angle deposition process at a first angle to form a first feature over the exposed material layer, and performing a second tilt-angle deposition process at a second angle to form a second feature over the exposed material layer. A deposition process may also be performed to form a third feature over the exposed material layer.

In yet another example, a method includes forming an undercut photoresist layer over a material layer; forming a window-opened photoresist layer over the undercut photoresist layer; forming an opening that extends through the window-opened photoresist layer and the undercut photoresist layer to expose the material layer; performing a first tilt-angle deposition process at a first angle to form a first feature over the exposed material layer; performing a second tilt-angle deposition process at a second angle to form a second feature over the exposed material layer; and after performing the first tilt-angle deposition process and the second tilt-angle deposition processes, removing the window-opened photoresist layer and the undercut photoresist layer. Performing the first tilt-angle deposition process and the second tilt-angle deposition may include forming a patterned hard mask layer over the material layer. The method may use the patterned hard mask layer to etch the material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first resist layer over a material layer;
   forming a second resist layer over the first resist layer;
   forming an opening that extends through the second resist layer and the first resist layer to expose the material layer, wherein the opening has a substantially constant first width in the second resist layer and a tapered width in the first resist layer,
      wherein the tapered width tapers from the first width at a top portion of the first resist layer to a second width at a bottom portion of the first resist layer,
      wherein the second width is wider than the first width, and
      wherein the top portion of the first resist layer is closer to the second resist layer than the bottom portion of the first resist layer; and
   performing a tilt-angle deposition process to form a feature over the exposed material layer.

2. The method of claim 1 wherein the performing the tilt angle deposition process includes:
   performing a first tilt-angle deposition process at a first angle to form a first feature over the exposed material layer; and
   performing a second tilt-angle deposition process at a second angle to form a second feature over the exposed material layer.

3. The method of claim 2 wherein the performing the first tilt-angle deposition process at the first angle and the performing the second tilt-angle deposition process at the second angle includes adjusting the first angle and the second angle to achieve a first desired width for the first feature and a second desired width for the second feature.

4. The method of claim 2 wherein the performing the first-tilt angle deposition process at the first angle and the performing the second-tilt angle deposition process at the second angle includes adjusting the first angle and the second angle to achieve a desired pitch between the first feature and the second feature.

5. The method of claim 2 wherein:
   the performing the first tilt-angle deposition process at the first angle to form the first feature includes depositing a first material; and
   the performing the second tilt-angle deposition process at the second angle to form the second feature includes depositing a second material.

6. The method of claim 5 wherein the depositing the first material and the second material includes depositing a patterned hard mask layer over the exposed material layer.

7. The method of claim 1 further including using a lift-off process to remove the first resist layer and the second resist layer.

8. The method of claim 7 further including using the feature as a mask to etch the material layer.

9. The method of claim 2 further including performing a deposition process to form another feature over the exposed material layer.

10. The method of claim 1 wherein:
    the material layer is positioned on a substrate holder; and
    the performing the tilt-angle deposition process includes rotating the substrate holder to achieve a tilt angle for the tilt-angle deposition process.

11. A method comprising:
forming a photoresist layer over a material layer;
performing a lithography process on the photoresist layer to foam an opening in the photoresist layer that exposes the material layer, the opening having an undercut profile;
forming a feature over the exposed material layer, wherein the forming the feature includes performing at least two tilt-angle deposition processes;
performing a first tilt-angle deposition process and a second tilt-angle deposition process, wherein the first tilt-angle deposition process and the second tilt-angle deposition process narrow the opening in the photoresist layer; and
after performing the first tilt-angle deposition process and the second tilt-angle deposition process, performing a deposition process to form another feature over the exposed material layer,
wherein the opening is defined by first and second opposing sidewalls in a topmost portion of the photoresist and third and fourth opposing sidewalls in a bottommost portion,
wherein the first and second opposing sidewalls are spaced apart by a substantially constant width throughout,
wherein the third and fourth opposing sidewalls are spaced apart by the substantially constant width towards the first and second opposing sidewalls and by a second width towards the material layer, and
wherein the second width is wider than the substantially constant width.

12. The method of claim 11 wherein forming the feature over the exposed material layer further includes forming a patterned hard mask layer over the exposed material layer.

13. The method of claim 12 further including varying one of a thickness of the photoresist layer, a width of the opening in the photoresist layer, and a tilt angle of each of the at least two tilt-angle deposition processes to achieve a desired size and pitch of the patterned hard mask layer.

14. The method of claim 12 further including:
removing the photoresist layer; and
using the patterned hard mask layer to etch the material layer.

15. The method of claim 11 wherein the forming the feature over the exposed material layer further includes:
performing the first tilt-angle deposition process at a first angle to form a first feature over the exposed material layer; and
performing the second tilt-angle deposition process at a second angle to form a second feature over the exposed material layer.

16. A method comprising:
forming an undercut photoresist layer over a material layer;
forming a window-opened photoresist layer over the undercut photoresist layer, wherein the forming the window-opened photoresist layer includes exposing regions of the window-opened photoresist layer to an ultraviolet radiation;
forming an opening that extends through the window-opened photoresist layer and the undercut photoresist layer to expose the material layer,
wherein the opening is defined by a first width between opposing sidewalls of the window-opened photoresist layer,
wherein the first width is substantially equal throughout the window-opened photoresist layer,
wherein the opening is further defined by a tapered width between opposing sidewalls of the undercut photoresist layer,
wherein the tapered width tapers from the first width adjacent the window-opened photoresist to a second width adjacent the material layer, and
wherein the second width is wider than the first width;
performing a first tilt-angle deposition process at a first angle to form a first feature over the exposed material layer;
performing a second tilt-angle deposition process at a second angle to form a second feature over the exposed material layer; and
after performing the first tilt-angle deposition process and the second tilt-angle deposition processes, removing the window-opened photoresist layer and the undercut photoresist layer.

17. The method of claim 16 wherein the performing the first tilt-angle deposition process at the first angle to form the first feature over the exposed material layer and the performing the second tilt-angle deposition process at the second angle to form the second feature over the exposed material layer includes forming a patterned hard mask layer over the material layer.

18. The method of claim 17 further including using the patterned hard mask layer to etch the material layer.

19. The method of claim 1, wherein the tapered width tapers from the first width to the second width in an arcuate manner.

20. The method of claim 11, wherein the first opposing sidewall directly contacts the third opposing sidewall, and wherein the second opposing sidewall directly contacts the fourth opposing sidewall.

* * * * *